United States Patent
Deimling et al.

(10) Patent No.: US 8,410,779 B2
(45) Date of Patent: Apr. 2, 2013

(54) CONTRAST AGENT-FREE MR ANGIOGRAPHY WITH SSFP SEQUENCES

(75) Inventors: Michael Deimling, Moehrendorf (DE); Alto Stemmer, Abenberg (DE)

(73) Assignee: Siemens Aktiengesellschaft, Munich (DE)

( * ) Notice: Subject to any disclaimer, the term of this patent is extended or adjusted under 35 U.S.C. 154(b) by 342 days.

(21) Appl. No.: 12/850,705

(22) Filed: Aug. 5, 2010

(65) Prior Publication Data
US 2011/0031971 A1 Feb. 10, 2011

(30) Foreign Application Priority Data
Aug. 5, 2009 (DE) .................. 10 2009 036 237

(51) Int. Cl.
*G01V 3/00* (2006.01)
(52) U.S. Cl. ..................................................... 324/309
(58) Field of Classification Search ........... 324/300–322
See application file for complete search history.

(56) References Cited

U.S. PATENT DOCUMENTS
2002/0183612 A1 12/2002 Deimling
2005/0258830 A1 11/2005 Deimling
2009/0143666 A1* 6/2009 Edelman et al. .............. 600/410

OTHER PUBLICATIONS

"Flow Compensation in Balanced SSFP Sequences," Bieri et al., Magnetic Resonance in Medicine, vol. 54 (2005) pp. 901-907.
"In-Plane Velocity Encoding With Coherent Steady-State Imaging," Grinstead et al., Magnetic Resonance in Medicine, vol. 54 (2005) pp. 138-145.
"Flow Artifacts in Steady-State Free Precession Cine Imaging," Storey et al., Magnetic Resonance in Medicine, vol. 51 (2004) pp. 115-122.
"Spoiling of Transverse Magnetization in Steady-State Sequences," Zur et al., Magnetic Resonance in Medicine, vol. 21 (1991) pp. 251-263.
"Improvement in Separation of Arteries from Veins in Peripheral Non-contrast MRA using Flow-Dephasing Spoiler Gradient Pulses in ECG-triggered 3D half-Fourier FSE," Miyazaki et al., Proc. Intl. Soc. Mag. Reson. Med., 10 (2002) p. 1751.

* cited by examiner

*Primary Examiner* — Melissa Koval
*Assistant Examiner* — Daniel Miller
(74) *Attorney, Agent, or Firm* — Schiff Hardin LLP

(57) ABSTRACT

In a method to generate an MR angiography image of an examination region of a subject without the use of contrast agent, a first MR image of the examination region is acquired with a first imaging sequence in which a gradient-induced phase development for unmoved and moved spins is essentially completely rephased at the end of a repetition interval TR, and a second MR image of the examination region is acquired with a second imaging sequence in which the gradient-induced phase development for unmoved spins is likewise essentially completely rephased at the end of the repetition interval TR and a rest phase $\phi_{rest}$ for moved spins remains at the end of the repetition interval TR. The second MR image is subtracted from the first MR image to generate the MR angiography image.

12 Claims, 4 Drawing Sheets

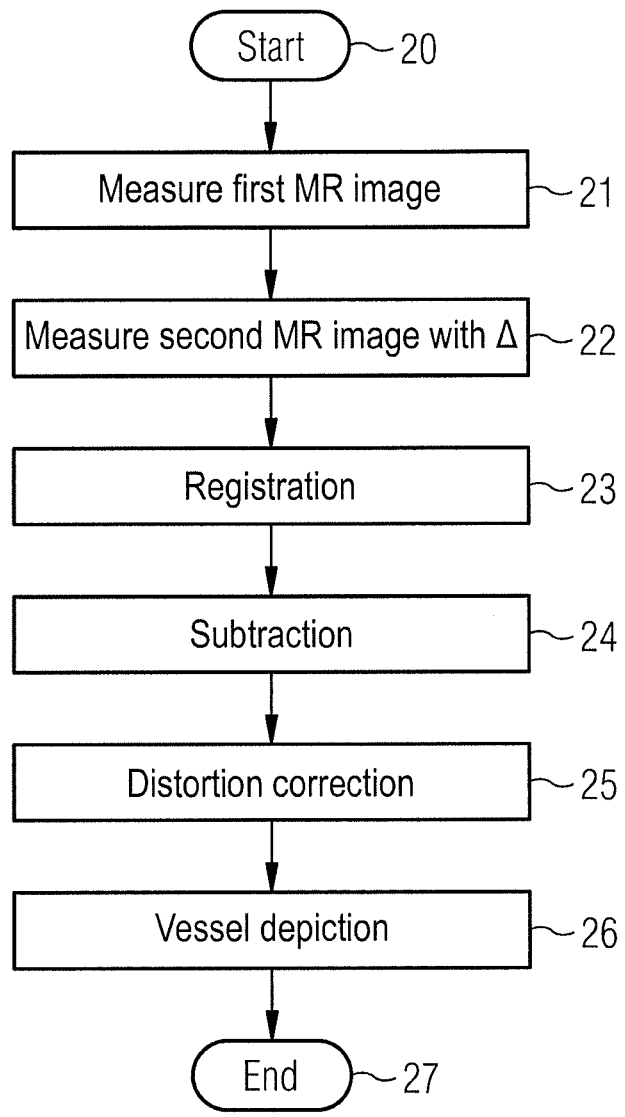

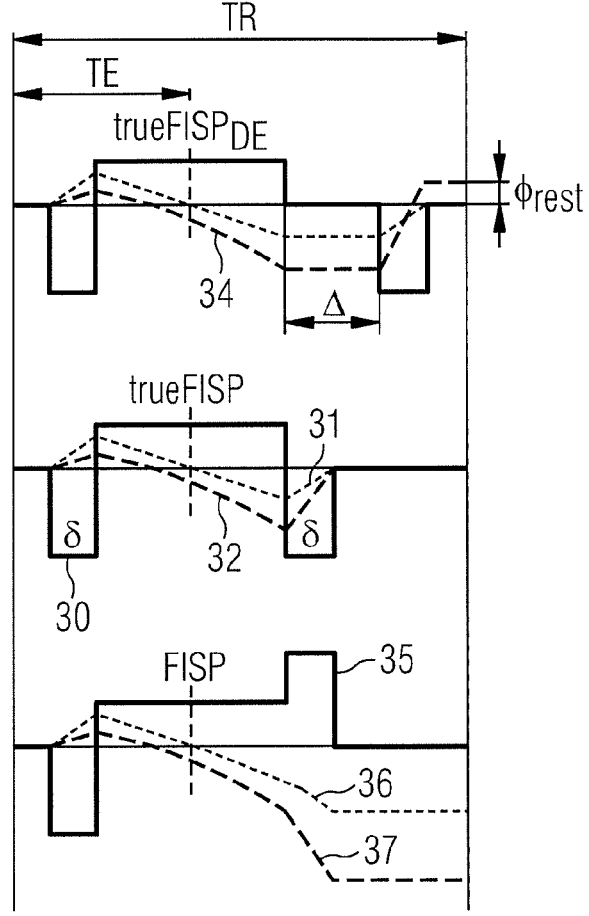
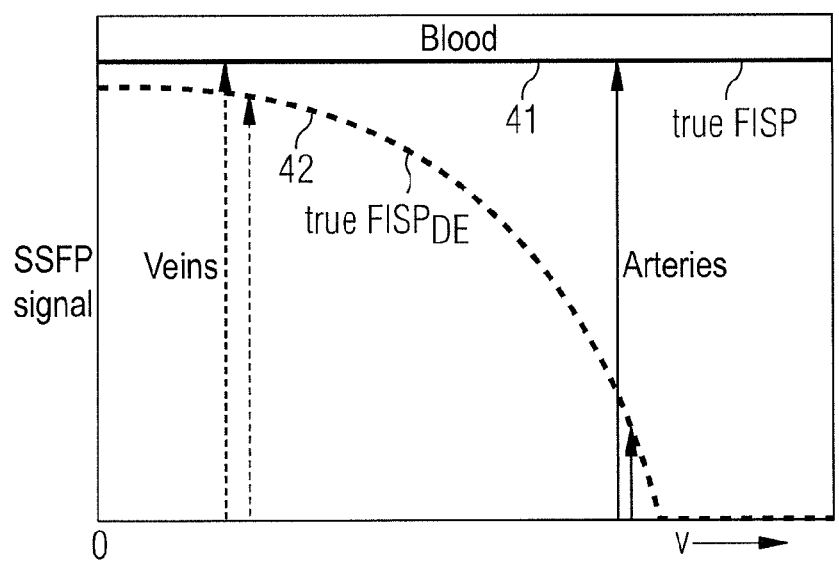

CONTRAST AGENT-FREE MR ANGIOGRAPHY WITH SSFP SEQUENCES

BACKGROUND OF THE INVENTION

1. Field of the Invention

The present invention concerns a method to create an MR angiography image of an examination region and a magnetic resonance system for this. The invention in particular concerns the generation of MR angiography images without use of contrast agent, based on SSFP (Steady State Free Precession) signals.

2. Description of the Prior Art

Contrast agent-enhanced MR angiography is in widespread use due to its high image signal, its short acquisition time and the minimal movement artifacts with simultaneously high spatial resolution. Very fast imaging sequences and an adapted time lapse of the contrast agent bolus with the data acquisition allow the separation of the arterial blood vessels from the venous blood vessels. However, in examination subjects for whom there is a high risk of developing an NSF illness (Nephrogenetic Systemic Fibrosis), contrast agent-enhanced MR angiography should be avoided. Multiple techniques are possible as alternatives: time-of-flight (ToF) angiography is a non-invasive scheme to utilize the effect of incoming, unsaturated spins perpendicularly in the 2D or 3D volume. However, a time-consuming multislice measurement protocol is required for application to peripheral vessels in the legs, for example. Furthermore, phase-sensitive MR angiography methods are known. However, these phase-sensitive methods require an a priori knowledge of the occurring velocity interval of the vessels to be shown. This knowledge is required in order to avoid phase transitions at 0° or 180° (known as phase wrapping).

SUMMARY OF THE INVENTION

An object of the present invention is to enable the generation of MR angiography images, without using contrast agent, in a manner that is simple to implement.

In a first embodiment of the invention, a method is provided to generate an MR angiography image of an examination region in which a first MR image of the examination region is acquired with a first imaging sequence in which a gradient-induced phase development for unmoved and moved spins is essentially completely rephased at the end of a repetition interval TR. In an additional step, a second MR image of the examination region is acquired with a second imaging sequence. In this second imaging sequence the gradient-induced phase development for unmoved spins is likewise essentially rephased at the end of the repetition interval TR. However, for moved spins the imaging sequence is fashioned such that a rest phase $\phi_{rest}$ remains at the end of the repetition interval TR. The second MR image is subsequently subtracted from the first MR image in order to generate the MR angiography image. If a spatially dependent rest phase is accumulated during the repetition interval, the MRT signal that is used to generate the MR image is completely destroyed. The term "moved spin" in sense of the present invention means spins that proceed with constant velocity. Expressed otherwise, in the second imaging sequence the zeroth gradient moment (which corresponds to tissue at rest) is zero while the first gradient moment for spins with constant velocity is no longer zero at the end of the repetition interval TR.

The first imaging sequence and the second imaging sequence are advantageously based on an SSFP (Steady State Free Precession) imaging sequence. In an SSFP sequence a magnetization is formed in the steady state [equilibrium state] via a sequence of n RF pulses, with the condition that the repetition time TR—i.e. the time interval between two RF pulses—is smaller than T2. The present invention is based on the very high intrinsic signal sensitivity of the SSFP signal to flow or phase instabilities from TR interval to TR interval. Furthermore, the first and second imaging sequences are advantageously True FISP imaging sequences. A True FISP imaging sequence is a special form of gradient echo sequence in which the echo signal is generated exclusively via gradient reversal, wherein in a True FISP sequence the gradient shifts exhibit a complete symmetry in the time period and are balanced out. This means that all magnetization portions are refocused so that the steady state signal arises after a short oscillation time.

In one embodiment of the invention, to generate the rest phase $\phi_{rest}$ at the readout gradients in the second imaging sequence a time interval $\Delta$ is inserted between the end of an MR signal readout interval and a rephasing gradient of the True FISP imaging sequence, before the rephasing gradient is switched. The additionally inserted time interval $\Delta$ leads to a resulting phase for moved spins after the switching of all gradients in the readout direction at the end, before the time interval TR, such that the first gradient moment is no longer zero.

The repetition interval TR is advantageously the same for the two imaging sequences. In vessel presentations with large fields of view, what are known as off-resonance artifacts can occur in the MR image that depend on the repetition time TR. If the time interval TR is now the same for both measurements, the artifacts are essentially at the same point in both images. Since the MR images acquired with the first and second imaging sequence are subtracted from one another, these off-resonance artifacts no longer occur since they are removed by the subtraction.

Furthermore, all geometric MR imaging parameters—for instance field of view, spatial resolution, bandwidth etc.—are advantageously the same for both MR images in order to be able to implement a subtraction of the second MR image from the first MR image more simply.

Due to the additionally inserted time interval $\Delta$, the moved spins are no longer refocused to zero at the end of the repetition interval TR. In order to additionally increase the phase development or, respectively, the first gradient moment, for example, it is possible to switch an additional, bipolar gradient shift with compensated zeroth gradient moment during this time interval. For moved spins an additionally pronounced phase hereby results at the end of this bipolar gradient shift, such that overall the rest phase $\phi_{rest}$ is increased. This additional bipolar gradient shift can be inserted in the slice selection direction, in the phase coding direction and in the readout direction, wherein an insertion is possible in one or more of the preceding directions.

Another possibility to increase the rest phases at the end of the repetition interval or, respectively, the gradient moment is to modify the gradient shift in the readout direction in the second imaging sequence such that the gradient echo signal does not occur in the middle of the signal readout interval (as is typical) but rather is temporally offset, i.e. either before or after the middle. An additional possibility to generate a rest phase $\phi_{rest}$ at the end of TR is to use an asymmetrical RF pulse to excite the magnetization in the second imaging sequence, in which asymmetrical RF pulse a transversal magnetization is rotated after excitation of the magnetization. For such asymmetrical RF pulses it also applies that the first gradient moment for moved spins is not equal to zero. For example, the inserted time interval Δ can be between 0.5 and 2.5 ms, advantageously with a value between 1 and 2 ms.

If, in addition to the two True FISP imaging sequences with and without time interval Δ, a normal FISP imaging sequence of the examination region is acquired, it is thus possible to create MR angiography images with the depiction of arteries and veins, MR angiography images with only depiction of the arteries and MR angiography images with only depiction of the veins.

To correct movement artifacts of the examination region between the two imaging sequences, a registration can ensue in which a compensation of the of the two MR images ensues such that the same anatomical regions are subtracted from one another in the difference imaging. A correction of the gradient inhomogeneities or the $B_0$ field inhomogeneities before the actual generation of the MR angiography image is likewise possible.

The invention furthermore concerns a magnetic resonance system to create the MR angiography image with an imaging control unit to acquire the first and second MR image with the first and second imaging sequence, and an image computer that generates the difference of the second MR image from the first MR image for the generation of the MR angiography image. The imaging sequence can be a 2D imaging sequence with the successive acquisition of multiple slices; however, a 3D data acquisition is also possible. The invention likewise concerns non-transitory computer-readable storage medium encoded with programming instructions that cause the method described above to be executed by a computer in which the storage medium is loaded.

BRIEF DESCRIPTION OF THE DRAWINGS

FIG. 2 is a flow diagram with the steps to generate the MR angiography image in accordance with the invention.

FIG. 3 shows the phase development in the readout direction given the True FISP sequence with and without insertion of the time interval Δ.

FIG. 4 schematically illustrates the SSFP signal for arteries and veins for an understanding of the invention.

DESCRIPTION OF THE PREFERRED EMBODIMENTS

Figure 1:
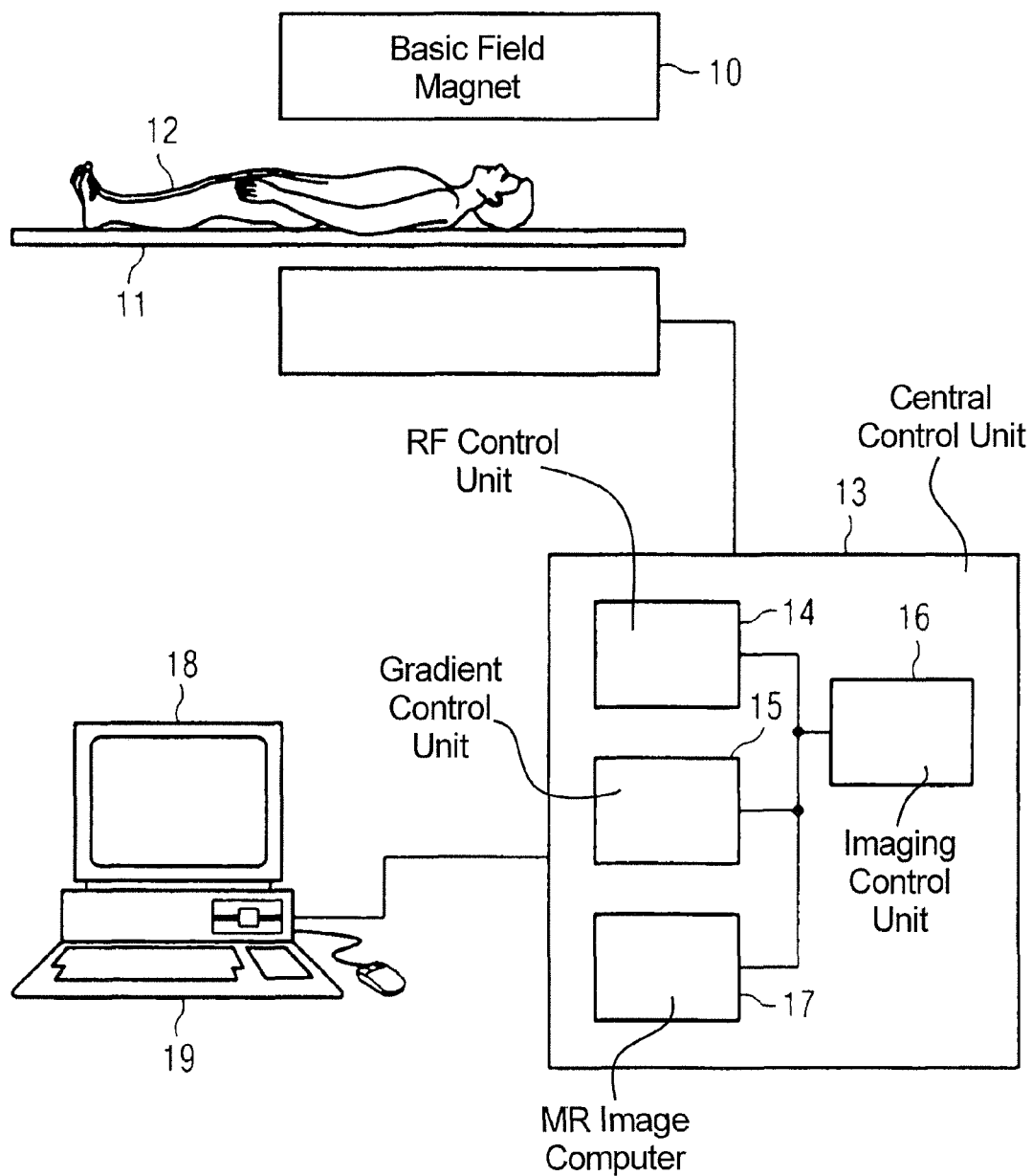
FIG. 1 schematically illustrates an MR system with which an MR angiography image can be generated without contrast agent.

An MR system with which MR angiography measurements are possible without contrast agent and without EKG triggering—for example with which arteries can be shown separate from the veins and veins can be shown separate from the arteries—is schematically shown in FIG. 1. The MR system has a magnet 10 for the generation of a polarization field $B_0$. An examination subject 12 on a bed 11 is moved into the center of the magnet in order to acquire data for the MR images. The magnetization generated by the polarization field $B_0$ is deflected by the radiation of a sequence RF pulse and switching of magnetic field gradients, causing MR signals to be induced in acquisition coils (not shown). The general mode of operation to generate MR images with different imaging sequences is known in principle to those skilled in the art, such that a detailed explanation of the individual MR components is not necessary herein. The MR system furthermore has a central control unit 13 that is used to control the MR system and that includes a radio-frequency (RF) control unit 14, a magnetic field gradient control unit 15 and an imaging control unit 16 that controls the sequence of the radiated RF pulses and the switching of magnetic field gradients depending on the desired image contrast and the set imaging sequence. From the detected MR signals the MR image computer 17 calculates MR images in a known manner, which can be displayed on a display unit 18 of the MR system—the MR system can be controlled by an operator via an operating console 19. To generate the MR angiography images, an SSFP signal is used that results in the sequence of multiple RF pulses when the time interval TR between two RF pulses is smaller than the relaxation time T2. If a spatially dependent phase φ(x) is accumulated during a TR interval and if this does not vary linearly with x, the SSFP signal is completely destroyed. This behavior is then utilized according to the invention in order to generate the MR angiography images.

The basic steps of the method are shown in FIG. 2. After the start of the method in Step 20, a first MR image is generated or, respectively, multiple MR images are generated in a 2D slice technique or in a 3D technique (Step 21). A True FISP sequence with complete symmetry of the gradient shifts in the time period and complete refocusing of the phases at the end of the time interval TR is used as an imaging sequence. For example, in FIG. 3 the gradient shift 30 in the readout direction is shown for a standard True FISP sequence. As is apparent in the middle gradient curve, a positive gradient during which the signal readout takes place ensues after a negative gradient, followed in turn by a negative gradient. The zeroth gradient moment $M_0$ is hereby 0, as results from the phase curve 31. The phase development 32 at the end of the gradient shift is 0 even for spins with constant velocity, which means that the first gradient moment $M_1$ is likewise 0. As is known from the True FISP sequence, the RF pulse series can be radiated with alternating phase. The use of CISS sequences instead of the True FISP sequences is likewise possible, wherein CISS sequences have a progression of multiple, phase-cyclical True FISP sequences with respectively altered RF excitation scheme.

As also shown in FIG. 2, in a next Step 22 at least one additional MR image is acquired with the True FISP or CISS sequence, wherein the gradient shift in the readout direction is represented by the gradient curve 33 (as at the top in FIG. 3). Before switching the last rephasing negative gradient, a time interval Δ is inserted which leads to the situation that the phase development 34 of moved spins is no longer refocused; rather, a rest phase $φ_{rest}$ results. Furthermore, for stationary spins the phase development at the end of the CR interval is 0. This means that the first gradient moment at the end of the TR interval is no longer 0. If the gradient ramp at the activation of the gradient is not taken into account and equal dephasing or, respectively, rephasing gradient strengths are assumed, the first gradient moment $M_1$ in this example is as follows:

$$-Gf_0^δ τδτ + Gf_δ^{3δ} τδτ - Gf_{3δ+Δ}^{4δ+Δ} τδτ = -GδΔ \quad (1)$$

wherein G is the gradient strength, δ is the gradient pulse duration and Δ is the time interval. For non-stationary, moved spins, the introduction of this rest phase leads to the destruction of the SSFP signal. The standard True FISP sequence and modified sequence in Step 22 are not compensated for movement in all three spatial directions (i.e. in the slice selection direction, readout direction and phase coding direction) at the echo point in time TE. Due to the very short echo time, however, the intravoxel dephasing is very slight. The bipolar phase coding shift retains the SSFP state for stationary spins due to the gradient moment of zeroth order $M_0$ equal to 0, but not for moved spins (given which the gradient moment of first order $M_1$ is not equal to 0). The effect on the signal is thereby much less compared to the effect of a readout direction due to the lower gradient amplitude in proximity to the k-space center. The resulting signals and how the signals can be used to generate MR angiography images is apparent in connection with FIG. 4. There the SSFP signal is shown dependent on the flow velocity. For constant flow velocities, the signal of the blood is constant due to the rephasing gradient shift, as shown in Graph 41. Graph 42 describes the signal development depending on the flow velocity for the imaging sequence with inserted time interval Δ. For low flow velocities, the signal intensity is still high overall before it decreases at higher flow velocities and finally becomes zero entirely. After subtraction of the second MR measurement from the first MR measurement, unmoved tissue with signal zero is shown, for example the signal of fat and musculature. Veins are shown with a very low signal intensity while arteries are shown with high signal intensity (as is apparent from FIG. 4).

Since a movement of the examination region can have occurred between the acquisition of the first MR image in Step 21 and the acquisition of the second MR image in Step 22, a registration can optionally ensue in Step 23 in order to ensure that the same anatomical regions in the MR images are subtracted from one another. The second MR image can then be subtracted from the first MR image in Step 24, by means of a simple subtraction or a self-weighted subtraction. For the self-weighted subtraction, the amount of the second MR image to be subtracted is weighted with a weighting factor, with the weighting factor depending on the value of the quotient of the second MR image and the first MR image signal, for example as is described in DE 101 21 802 A1. For the vessel depiction of the extremities given a large field of view, what are known as off-resonance artifacts of the True FISP sequence can be reduced via phase-cyclical SSFP schemes (for example CISS), for example as its described (among other things) in DE 10 2004 025 417 A1.

In a further Step 25, a distortion correction can be conducted in which a possible gradient field inhomogeneity is determined and subsequently corrected, or a $B_0$ field inhomogeneity is determined and subsequently used for a correction.

For example, the vessel depiction can be presented with a MIP (Maximum Intensity Protection) method as is generally known or with the use of a vessel tree (Step 26). A stereographic depiction of the vessels is likewise possible.

The method then ends in Step 27.

In order to further intensify the additional phase development in the measurement of the second MR image, during the time interval Δ it is possible to switch an additional bipolar gradient field in which the zeroth gradient moment is 0 but the first gradient moment is not 0. For example, for such a bipolar gradient shift the first gradient moment reads $$+G\int_0^{\frac{\Delta}{2}} \tau \delta\tau - G\int_{\frac{\Delta}{2}}^{\Delta} \tau \delta\tau = -G/4\Delta^2 \quad (2)$$

Figure 5:
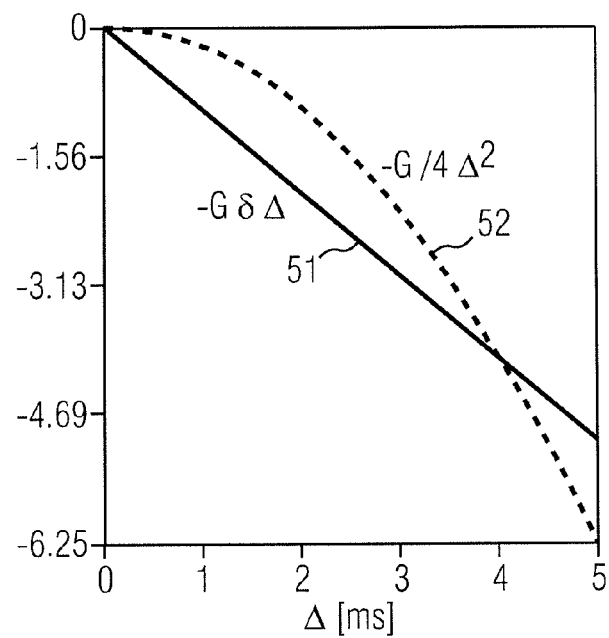
FIG. 5 shows the dependency of a gradient moment as a function of the time interval Δ.

The dependency of the gradient moment as a function of Δ is schematically shown in FIG. 5; the magnitude of the bipolar gradient is shown in Graph 51 and the absolute value of the modified True FISP sequence with additionally inserted time interval δ is shown in Graph 52. In order to minimize off-resonance artifacts given True FISP, it is important to keep the repetition time TR as short as possible. However, a TR extension of approximately 1 ms due to the insertion of Δ is tolerable and produces a sufficiently strong first gradient moment. The gradient moment that is additionally indexed by the bipolar gradient shift in Graph 52 would be used in addition to Graph 51. As is apparent from FIG. 5, however, the effect of this additional bipolar shift for time interval is up to 4 ms smaller than the phase effect due to insertion of time interval Δ.

The described dephasing effect in the SSFP sequence can also be used by inserting a time interval Δ, even in non-Cartesian k-space sampling methods.

Figure 6:
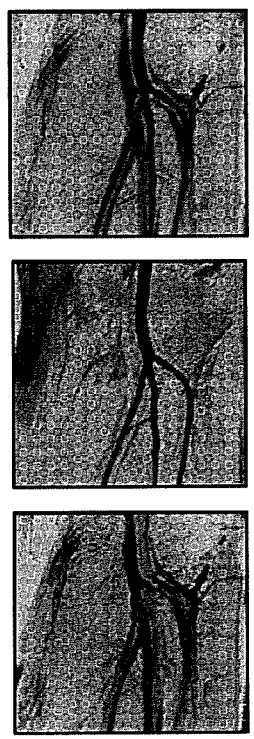
FIG. 6 is a depiction of arteries and veins in the upper image, the depiction of arteries only in the middle image and predominantly the depiction of the veins in the lower image.

As is apparent from FIG. 6, a separation of veins and arteries can be achieved by additional measurement of a data set with a conventional FISP sequence. The gradient curve of a conventional FISP sequence is shown with 35 in FIG. 3. As the phase developments 36 and 37 show, the phase development at the end of the repetition interval TR is not 0 for either stationary spins or moved spins. As was apparent in FIG. 4, the arteries are shown light given generation of MR angiography with the Steps from FIG. 2 while the veins exhibit less of a signal. The angiography data set shown at the top in FIG. 6 is obtained if the first MR image is generated with the use of a standard True FISP sequence (as in Step 21) and the second MR image is generated with the use of a standard FISP sequence. When the image data of the FISP sequence are subtracted from the image data of the True FISP sequence, a depiction of veins and arteries results. Given the differentiation as explained in FIG. 2, it is primarily the arteries that result in the MR image (recognizable in the middle image of FIG. 6) while it is primarily the veins that are apparent in the lower MR image. The lower MR angiography image of FIG. 6 is obtained by generating the second MR image with the time interval Δ minus the MR image data of a conventional FISP sequence.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to generate a non-contrast magnetic resonance (MR) angiography image of an examination region of a subject, comprising the steps of:

operating an MR data acquisition unit with an examination subject therein to acquire a first MR image of an examination region of the subject using a first steady state free precession (SSFP) imaging sequence comprising a plurality of repetition intervals, in which a gradient-induced phase development for unmoved and moved nuclear spins in the examination region is substantially completely rephased at an end of each repetition interval;

operating the MR data acquisition unit with the examination subject therein to acquire a second MR image of the examination region using a second SSFP imaging sequence, also comprising a plurality of repetition intervals, in which the gradient-induced phase development for unmoved nuclear spins is also substantially completely rephased at an end of each repetition interval in the second imaging sequence, and in which a rest phase for moved nuclear spins exists at the end of each repetition interval of the second imaging sequence, wherein said second SSFP imaging sequence comprises a readout gradient and a rephasing gradient, and wherein operating said MR data acquisition unit to acquire said second MR image comprises inserting a time interval into said readout gradient between an end of a MR signal readout and said rephasing gradient, before activation of said rephasing gradient, to generate said rest phase such that said rest phase destroys an SSFP signal of said moved nuclear spins; and supplying said first MR image and said second MR image to a computerized processor and, in said processor, subtracting said second MR image from said first MR image to generate a non-contrast MR angiography image of the examination region.

2. A method as claimed in claim 1 wherein said time interval is in a range between 0.5 and 2.5 ms.

3. A method as claimed in claim 1 wherein each of said first imaging sequence and the said second imaging sequence is a True FISP imaging sequence.

4. A method as claimed in claim 1 wherein the repetition interval in said first imaging sequence is substantially equal to the repetition interval in said second imaging sequence.

5. A method as claimed in claim 1 wherein each of said first and second imaging sequences is defined by geometric MR imaging parameters, with the geometric MR imaging parameters for said first imaging sequence being substantially the same as the geometric MR imaging parameters of the second imaging sequence.

6. A method as claimed in claim 1 wherein operating said MR data acquisition unit to acquire said second MR image comprises, during said time interval, activating an additional bipolar gradient shift in a direction selected from the group consisting of a slice direction, a phase coding direction and a readout direction.

7. A method as claimed in claim 6 comprising activating said bipolar gradient shift in said second imaging sequence to prevent occurrence of a gradient signal during readout of the MR signal in a middle of a signal readout duration.

8. A method as claimed in claim 1 comprising, in said second imaging sequence, generating an asymmetrical radio frequency (RF) pulse to excite a magnetization in said examination region and to rotate a transverse magnetization in said examination region after excitation of said magnetization.

9. A method as claimed in claim 1 comprising operating said MR data acquisition unit to acquire an additional MR data set from the examination region using a FISP imaging sequence, with veins being shown separate from arteries, and arteries being shown separate from veins, and veins and arteries both being shown, with said first MR image, said second MR image and said additional MR data set.

10. A method as claimed in claim 1 comprising generating a $B_0$ field in said MR data acquisition unit during each of said first imaging sequence and said second imaging sequence, said $B_0$ field comprising $B_0$ inhomogeneities, and wherein gradients that are activated during said first imaging sequence and said second imaging sequence comprise gradient inhomogeneities and, in said processor, automatically correcting for at least one of said gradient inhomogeneities and said $B_0$ field inhomogeneities before generating said MR angiography image.

11. A magnetic resonance (MR) system that generates a non-contrast MR angiography image, comprising:

an MR data acquisition unit adapted to receive an examination subject therein;

a control unit configured to operate the MR data acquisition unit to acquire a first MR image of an examination region of the subject using a first steady state free precession (SSFP) imaging sequence comprising a plurality of repetition intervals, in which a gradient-induced phase development for unmoved and moved nuclear spins in the examination region is substantially completely rephased at an end of each repetition interval;

said control unit also configured to operate the MR data acquisition unit with the examination subject therein to acquire a second MR image of the examination region using a second SSFP imaging sequence, also comprising a plurality of repetition intervals, in which the gradient-induced phase development for unmoved nuclear spins is also substantially completely rephased at an end of each repetition interval in the second imaging sequence, and in which a rest phase for moved nuclear spins exists at the end of each repetition interval of the second imaging sequence, wherein said second SSFP imaging sequence comprises a readout gradient and a rephasing gradient, and wherein said control unit is configured to operate said MR data acquisition unit to acquire said second MR image by causing said MR data acquisition unit to insert a time interval into said readout gradient between an end of a MR signal readout and said rephasing gradient, before activation of said rephasing gradient, to generate said rest phase such that said rest phase destroys an SSFP signal of said moved nuclear spins; and a computerized processor supplied with said first MR image and said second MR image said processor being configured to subtract said second MR image from said first MR image to generate a non-contrast MR angiography image of the examination region.

12. A non-transitory computer-readable data storage medium encoded with programming instructions, said data storage medium being loaded into a computerized control and processing system of a magnetic resonance (MR) apparatus, which also comprises an MR data acquisition unit adapted to receive an examination subject therein, said programming instructions causing said computerized control and processing system to:

operate an MR data acquisition unit with an examination subject therein to acquire a first MR image of an examination region of the subject using a first steady state free precession (SSFP) imaging sequence comprising a plurality of repetition intervals, in which a gradient-induced phase development for unmoved and moved nuclear spins in the examination region is substantially completely rephased at an end of each repetition interval;

operate the MR data acquisition unit with the examination subject therein to acquire a second MR image of the examination region using a second SSFP imaging sequence, also comprising a plurality of repetition intervals, in which the gradient-induced phase development for unmoved nuclear spins is also substantially completely rephased at an end of each repetition interval in the second imaging sequence, and in which a rest phase for moved nuclear spins exists at the end of each repetition interval of the second imaging sequence, wherein said second SSFP imaging sequence comprises a readout gradient and a rephasing gradient, and wherein operation of said MR data acquisition unit to acquire said second MR image includes operation of said MR data acquisition unit to insert a time interval into said readout gradient between an end of a MR signal readout and said rephasing gradient, before activation of said rephasing gradient, to generate said rest phase such that said rest phase destroys an SSFP signal of said moved nuclear spins; and subtract said second MR image from said first MR image to generate a non-contrast MR angiography image of the examination region.

* * * * *